(12) United States Patent
Ruan et al.

(10) Patent No.: US 11,050,109 B2
(45) Date of Patent: Jun. 29, 2021

(54) CELL SUPERVISION CIRCUIT AND BATTERY PACK

(71) Applicant: Contemporary Amperex Technology Co., Limited, Ningde (CN)

(72) Inventors: Shengshen Ruan, Ningde (CN); Peng Wang, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 74 days.

(21) Appl. No.: 16/422,863

(22) Filed: May 24, 2019

(65) Prior Publication Data
US 2020/0161605 A1    May 21, 2020

(30) Foreign Application Priority Data
Nov. 15, 2018    (CN) .......................... 201821895875.2

(51) Int. Cl.
*H01M 2/10*    (2006.01)
*H01M 10/613*    (2014.01)
*H01M 50/20*    (2021.01)

(52) U.S. Cl.
CPC ......... *H01M 50/20* (2021.01); *H01M 10/613* (2015.04)

(58) Field of Classification Search
CPC ............. H01M 10/667; H01M 10/425; H01M 10/613; H01M 10/615; H01M 10/6557
See application file for complete search history.

(56) References Cited

U.S. PATENT DOCUMENTS

| 6,175,688 B1 * | 1/2001 | Cassidy ................ A61M 5/365 392/470 |
| 7,626,821 B1 | 12/2009 | Buffington |
| 2004/0211769 A1 * | 10/2004 | Merk ...................... H05B 3/342 219/494 |
| 2006/0169507 A1 | 8/2006 | Inoue et al. |

(Continued)

FOREIGN PATENT DOCUMENTS

| CN | 2686088 Y | 3/2005 |
| CN | 102522510 A | 6/2012 |

(Continued)

OTHER PUBLICATIONS

PCT International Search Report for PCT/CN2019/118666, dated Feb. 3, 2020, 11 pages.

(Continued)

*Primary Examiner* — Imran Akram
(74) *Attorney, Agent, or Firm* — Law Offices of Liaoteng Wang

(57) ABSTRACT

The disclosure relates to a cell supervision circuit and a battery pack. The cell supervision circuit comprises a circuit board; a heat transfer unit including a metal plate disposed adjacent to the circuit board, wherein the heat transfer unit dissipates heat through the metal plate; and a fixing plate connected to the heat transfer unit, wherein the fixing plate includes a body portion and an elastic portion formed on the body portion, and the elastic portion is used for filling a gap between the metal plate and the fixing plate. In the cell supervision circuit according to the embodiment of the disclosure, the problem of heat resistance instability generated during heat dissipation is solved, and the heat dissipation effect of the cell supervision circuit is improved.

9 Claims, 2 Drawing Sheets

(56) References Cited

U.S. PATENT DOCUMENTS

| | | | |
|---|---|---|---|
| 2007/0153483 A1 | 7/2007 | Refai-Ahmed et al. | |
| 2011/0109671 A1* | 5/2011 | Tai | B41J 29/393 |
| | | | 347/2 |
| 2011/0255303 A1* | 10/2011 | Nichol | G02B 6/0028 |
| | | | 362/606 |
| 2012/0028083 A1* | 2/2012 | Jung | H01M 10/486 |
| | | | 429/7 |
| 2013/0207596 A1* | 8/2013 | Zichner | H01M 10/04 |
| | | | 320/107 |
| 2013/0216867 A1* | 8/2013 | Schaefer | H01M 10/02 |
| | | | 429/7 |
| 2016/0134178 A1* | 5/2016 | Acinas Lope | B62D 5/0406 |
| | | | 310/64 |
| 2016/0143158 A1* | 5/2016 | Wakana | H05K 5/0013 |
| | | | 361/752 |
| 2016/0336561 A1* | 11/2016 | Miyao | H01M 10/6554 |
| 2017/0006738 A1* | 1/2017 | Lee | G02F 1/13452 |
| 2017/0222342 A1* | 8/2017 | Ho | H01R 12/71 |
| 2018/0261900 A1 | 9/2018 | Kim et al. | |
| 2018/0284854 A1* | 10/2018 | Sprenger | H05K 7/20336 |
| 2019/0379030 A1* | 12/2019 | Golubkov | H01M 50/502 |

FOREIGN PATENT DOCUMENTS

| | | |
|---|---|---|
| CN | 103176563 A | 6/2013 |
| CN | 204792925 U | 11/2015 |
| CN | 204906846 U | 12/2015 |
| CN | 205406596 U | 7/2016 |
| CN | 206116553 U | 4/2017 |
| CN | 206379400 U | 6/2017 |
| CN | 108093599 A | 5/2018 |
| CN | 207719292 U | 8/2018 |
| CN | 209071559 U | 7/2019 |
| DE | 202012012655 U1 | 12/2013 |

OTHER PUBLICATIONS

The extended European search report dated Jan. 7, 2020 for European Application No. 19275071.9 8 pages.
The Examination report dated Aug. 10, 2020 for European application No. 19275071.9, 13 pages.

* cited by examiner

CELL SUPERVISION CIRCUIT AND BATTERY PACK

CROSS-REFERENCE TO RELATED APPLICATION

This application is based on and claims priority to Chinese Patent Application No. 201821895875.2 filed on Nov. 15, 2018, which is incorporated herein by reference in its entirety.

TECHNICAL FIELD

The disclosure relates to the technical field of power battery, and in particular, to a cell supervision circuit and a battery pack.

BACKGROUND

A cell supervision circuit (CSC) is a control system of a power battery. Some of the heating devices in the CSC generate a large amount of heat, which will cause heat concentration after continuous operation. If the cell supervision circuit is in high temperature for a long time, its performance may decrease, affecting the safety of the power battery.

Nowadays, the CSC generally transfers heat to the external fixing plate through the heat transfer unit. The heat transfer unit and the external fixing plate are metal plates having large area. Since the flatness of the heat transfer unit and the external fixing plate are deviated due to the limited processing accuracy of the components, there is a gap in the heat dissipation interface after the heat transfer unit and the external fixing plate are rigidly connected. This leads to the problem of heat resistance instability generated when heat is transferred between the heat dissipation interfaces, affecting the heat dissipation effect of CSC.

SUMMARY

An object of the embodiment of the disclosure is to provide a cell supervision circuit and a battery pack, which are beneficial to solve the problem of heat resistance instability during heat dissipation using the heat dissipation device.

An embodiment of the disclosure provides a cell supervision circuit comprising: a circuit board; a heat transfer unit including a metal plate disposed adjacent to the circuit board, wherein the heat transfer unit dissipates heat through the metal plate; and a fixing plate connected to the heat transfer unit, wherein the fixing plate includes a body portion and an elastic portion formed on the body portion, and the elastic portion is used for filling a gap between the metal plate and the fixing plate.

According to one aspect of the embodiment of the disclosure, the body portion of the fixing plate has a first surface and a second surface that are opposite to each other, the first surface is disposed adjacent to the metal plate, and the elastic portion is formed by being recessed from the body portion in a direction from the second surface to the first surface.

According to one aspect of the embodiment of the disclosure, notches are provided on both sides of the elastic portion, and the notches penetrates through the body portion.

According to one aspect of the embodiment of the disclosure, the elastic portion comprises two connecting members which are disposed to be spaced apart from each other, and the connecting member has one end which is hung with respect to the body portion.

According to an aspect of the embodiment of the disclosure, a groove is provided in the elastic portion, and the groove is formed by being recessed from the elastic portion in a direction from the first surface to the second surface.

According to one aspect of the embodiment of the disclosure, the number of the elastic portion is one or more, and the metal plate is fixedly connected with the elastic portion.

According to one aspect of the embodiment of the disclosure, the heat transfer unit further includes a backing plate for supporting the metal plate, a stepped groove is provided in the backing plate, and the metal plate is fitted into the stepped groove and is in contact with the elastic portion.

According to one aspect of the embodiment of the disclosure, two or more ribs are disposed to be spaced from each other on the backing plate to support the metal plate.

According to one aspect of the embodiment of the disclosure, a heat-conducting pad is further provided between the circuit board and the metal plate of the heat transfer unit.

Another embodiment of the disclosure further provides a battery pack comprising any one of the cell supervision circuits as described above.

In the cell supervision circuit according to the embodiment of the disclosure, the elastic portion is formed on the fixing plate connected with the heat transfer unit, and is brought into close contact with the metal plate for dissipating heat on the heat transfer unit to fill the gap between the metal plate and the fixing plate. Therefore, the problem of heat resistance instability during heat dissipation is solved, and the heat dissipation effect of the cell supervision circuit is improved. In addition, the battery pack according to the embodiment of the disclosure employs the cell supervision circuit as described above. Therefore, the safety and reliability of the battery pack is improved.

BRIEF DESCRIPTION OF THE DRAWINGS

Features, advantages, and technical effects of the exemplary embodiments of the disclosure will be described below with reference to the drawings.

In the drawings, the same reference numerals are used to indicate the same components. The drawings are not drawn to the actual scale.

DETAILED DESCRIPTION

Figure 1:
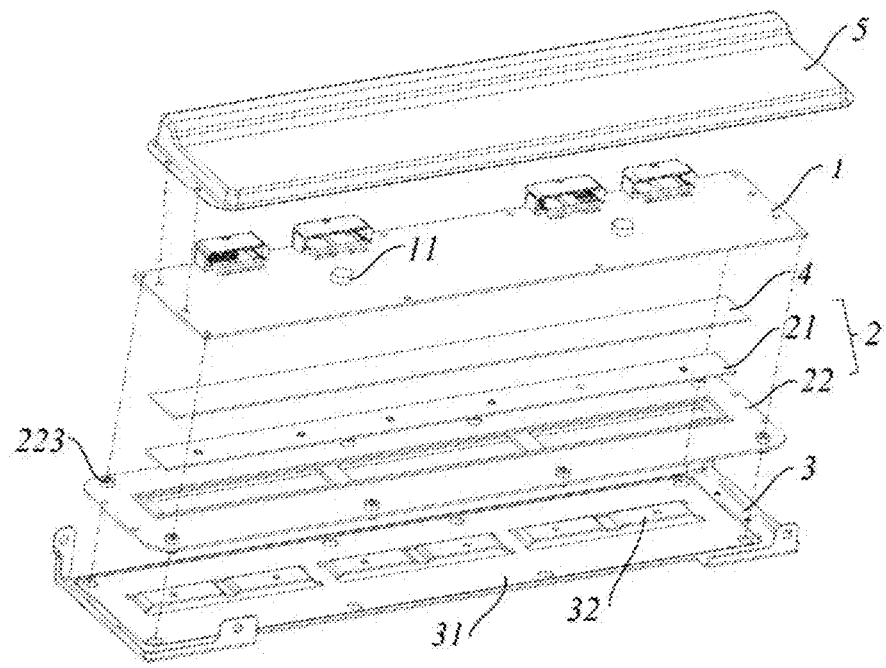
FIG. 1 shows a schematic structural view of a cell supervision circuit according to an embodiment of the disclosure.

Features and exemplary embodiments according to various aspects of the disclosure are described in detail below. In the following detailed description, numerous specific details are set forth to provide comprehensive understanding of the disclosure. However, it will be apparent to the skilled in the art that the disclosure may be practiced without some of the specific details. The following description of the embodiments is merely to provide better understanding of the disclosure. In the figures and the following description, at least some of the known structures and techniques are not shown, to avoid unnecessarily obscuring the disclosure. Further, for clarity, the dimension of some of the structures may be enlarged. Furthermore, the features, structures, or characteristics described hereinafter may be combined in any suitable manner in one or more embodiments.

The orientation terms appearing in the following description refer to the directions shown in the drawings, and are not intended to limit the specific structure of the disclosure. In the description of the disclosure, it should be noted that, unless otherwise stated, the terms "mount" and "connect" are to be understood broadly, for example, they may be fixed connection or detachable connection or integral connection; or may be direct connection or indirect connection. The specific meaning of the above terms in the disclosure may be understood by the skilled in the art based on the specific situation. Moreover, the terms "first", "second", and the like are used for descriptive purposes only, and should not to be construed as indicating or implying relative importance or implicitly indicating the number of the involved technical features. Thus, features involving "first", "second", and the like may include at least one of the features, either explicitly or implicitly.

In order for better understanding of the disclosure, the cell supervision circuit and the battery pack according to embodiments of the disclosure will be described in detail with reference to FIGS. 1 to 5.

The embodiment of the disclosure provides a cell supervision circuit, which comprises a circuit board 1, a heat transfer unit 2 and a fixing plate 3.

The electronic components 11 are provided on the circuit board 1. The electronic components 11 will generate heat due to electric current passing therethrough during operation. The heat transfer unit 2 includes a metal plate 21 which is disposed adjacent to the circuit board 1. The heat transfer unit 2 dissipates heat through the metal plate 21. The fixing plate 3 is connected to the heat transfer unit 2. The fixing plate 3 includes a body portion 31 and an elastic portion 32 which is formed on the body portion 31, and the elastic portion 32 is used for filling a gap between the metal plate 21 and the fixing plate 3.

In the cell supervision circuit according to the embodiment of the disclosure, the elastic portion 32 is provided on the fixing plate 3 connected with the heat transfer unit 2, and is brought into close contact with the metal plate 21 for dissipating heat on the heat transfer unit 2 to fill the gap between the metal plate 21 and the fixing plate 3. Therefore, the problem of heat resistance instability during heat dissipation is solved, and the heat dissipation effect of CSC is improved.

The specific structure of the CSC according to the embodiment of the disclosure is described in further detail below with reference to the accompanying drawings.

Figure 2:
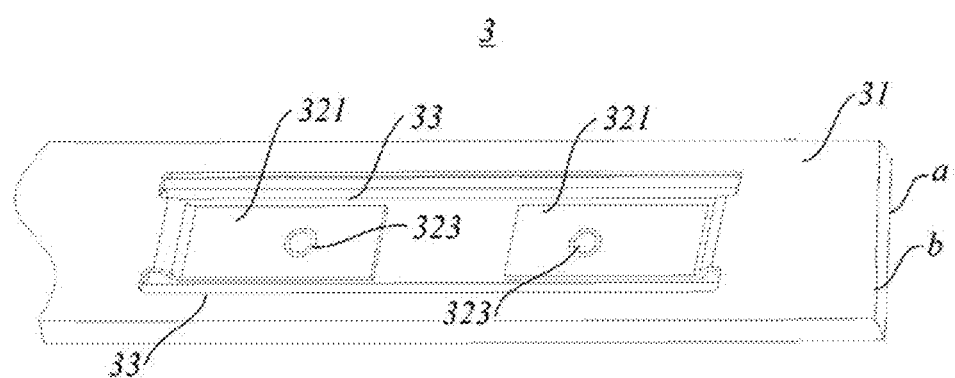
FIG. 2 shows a schematic structural view of a fixing plate of the cell supervision circuit shown in FIG. 1.

Referring to FIG. 2, the body portion 31 of the fixing plate 3 has a first surface a and a second surface b that are opposite to each other. The first surface a is disposed adjacent to the metal plate 21. The elastic portion 32 is formed by being recessed from the body portion 31 in a direction from the second surface b to the first surface a.

The fixing plate 3 is connected to the heat transfer unit 2, while the elastic portion 32 is recessed toward the metal plate 21. The elastic portion 32 is compressible due to its own elasticity, so that the metal plate 21 is in close contact with the elastic portion 32, and the gap between the metal plate 21 and the fixing plate 3 is adaptively adjusted. Therefore, a stable heat dissipation interface is formed between the metal plate 21 and the fixing plate 3, and thus the problem of heat resistance instability caused by machining flatness error of the metal plate 21 and the elastic portion 32 is solved.

Furthermore, notches 33 are provided on both sides of the elastic portion 32. Each of the notches 33 penetrates through the body portion 31. The notches 33 can release the stress of the elastic portion 32 and the body portion 31, thereby improving the elastic deformation ability of the elastic portion 32. The elastic portion 32 is stamped by the body portion 31, and its wall thickness, molding height, and compression deformation amount are designed and verified according to the specific application.

Furthermore, the elastic portion 32 includes two connecting members 321 which are disposed to be spaced apart from each other. Each connecting member 321 has one end which is hung with respect to the body portion 31. Thereby, the elastic deformation capability of the elastic portion 32 is further improved.

Figure 3:
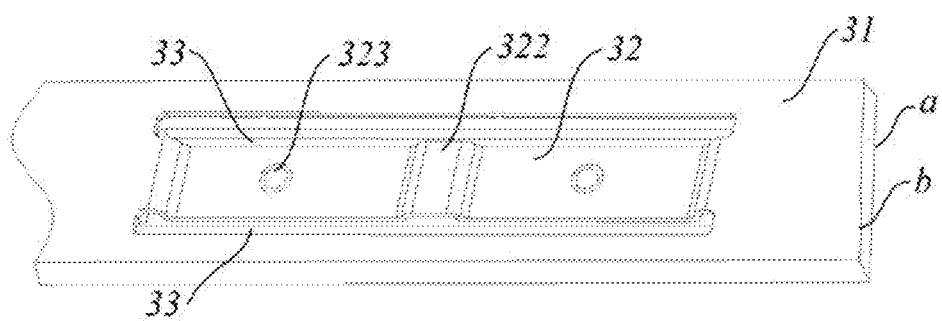
FIG. 3 shows a schematic structural view of another fixing plate of the cell supervision circuit shown in FIG. 1.

Referring to FIG. 3, a groove 322 is provided in the elastic portion 32. The groove 322 is formed by being recessed from the elastic portion 32 in the direction from the first surface a to the second surface b. By providing the groove 322 whose recessed direction is opposite to that of the elastic portion 32, the elastic deformation energy of the elastic portion 32 can be absorbed, and thereby the rigidity and strength of the elastic portion 32 can be improved. As compared with the structure of the elastic portion 32 shown in FIG. 2, the strength of the structure of the elastic portion 32 can be increased, and the contact area for dissipating heat between the elastic portion 32 and the metal plate 21 can be increased.

The number of the elastic portions 32 may be one or more. When the length dimension of the fixing plate 3 is small, only one elastic portion 32 may be formed on the body portion 31, and when the length dimension of the fixing plate 3 is large, two or more elastic portions 32 may be formed to be spaced apart from each other on the body portion 31.

Figure 4:
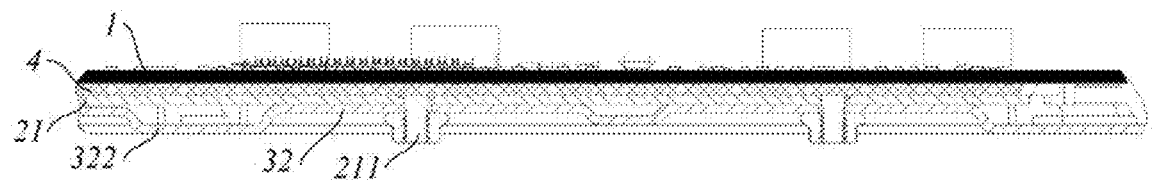
FIG. 4 shows a schematic view showing the assembling effect of the fixing plate and the heat transfer unit in the cell supervision circuit shown in FIG. 1.

Referring to FIG. 4, since the elastic portion 32 is stamped by the body portion 31, it is difficult to ensure its durability by the elasticity of the elastic portion 32 alone. In order to improve the reliability of the elastic portion 32, the metal plate 21 is fixedly connected to the elastic portion 32.

Specifically, fasteners 211 such as press rivets may be provided on the metal plate 21, and the corresponding mounting holes 323 may be provided in the elastic portion 32, as shown in FIGS. 2 and 3. The metal plate 21 is fixedly connected with the elastic portion 32 by the engagement of the nuts with the press rivets 211 passing through the mounting holes 323. The metal plate 21 and the elastic portion 32 may be fixedly connected to each other by welding.

Figure 5:
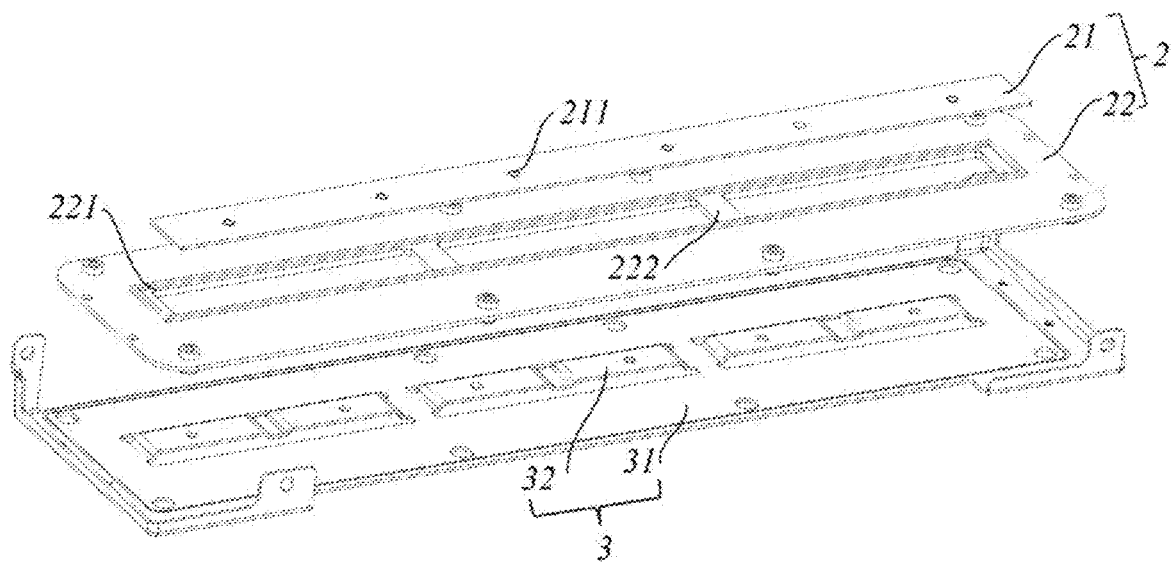
FIG. 5 shows a schematic exploded view of the fixing plate and the heat transfer unit in the cell supervision circuit shown in FIG. 4.

Referring to FIG. 5, in order to achieve a reliable connection between the metal plate 21 and the elastic portion 32, the heat transfer unit 2 further includes a backing plate 22 for supporting the metal plate 21. A stepped groove 221 is provided in the backing plate 22. The metal plate 21 is fitted into the stepped groove 221 and comes into contact with the elastic portion 32. The backing plate 22 may be a non-metallic member such as a plastic member. The metal plate 21 and the backing plate 22 may be integrally formed by insert molding, or may be manufactured separately and then directly assembled.

When the length of the metal plate 21 is long, two or more ribs 222 may be disposed to be spaced apart from each other in the stepped groove 221 to support the metal plate 21. Preferably, the ribs 222 may be provided corresponding to the interval between two adjacent elastic portions 32, so as not to affect the fixed connection between the metal plate 21 and the elastic portions 32.

Referring again to FIG. 1, in order to stabilize the heat dissipation interface between the circuit board 1 and the metal plate 21, a heat-conducting pad 4 is further provided between the circuit board 1 and the metal plate 21 of the heat transfer unit 2. The heat-conducting pad 4 is made of elastic material such as, but not limited to, silica gel plate. On one hand, the heat-conducting pad 4 can fill the gap between the circuit board 1 and the metal plate 21, and on the other hand, the heat-conducting pad 4 can rapidly transfer the heat generated by the heating devices 11 of the circuit board 1 to the metal plate 21, thereby improving the heat-conducting efficiency.

The heat transfer unit 2 is respectively connected to the circuit board 1 and the fixing plate 3 via the backing plate 22. Specifically, double-headed positioning posts 223 are provided on the backing plate 22. The double-headed positioning post 223 comprises a male end and a female end that are disposed coaxially. The male end has an external thread and is disposed toward the fixing plate 3, and the female end has an internal thread and is disposed toward the circuit board 1. The circuit board 1 is fixed to the backing plate 22 by engaging a screw with the female end, and the fixing plate 3 is fixed to the backing plate 22 by engaging a nut with the male end.

The cell supervision circuit further includes a housing 5 connected to the circuit board 1, to prevent impurities such as dust from falling onto the circuit board 1.

In addition, the embodiment of the disclosure also provides a battery pack, which comprises any one of the cell supervision circuits as described above, thereby solving the problem of heat dissipation of the local heat of the circuit board 1, and improving the safety and reliability of the battery pack.

Although the disclosure has been described with reference to the above preferred embodiments, various modifications may be made thereto and the components therein may be replaced with equivalents without departing from the scope of the disclosure. In particular, each technical feature mentioned in the various embodiments may be combined in any manner as long as there is no structural conflict. The disclosure is not limited to the specific embodiments disclosed herein, but includes all technical solutions falling within the scope of the claims.

REFERENCE NUMERALS 1 circuit board
11 electronic component
2 heat transfer unit
21 metal plate
211 press rivets
22 backing plate
221 stepped groove
222 rib
223 double-headed fastener
3 fixing plate
31 body portion
32 elastic portion
a first surface
b second surface
321 connecting member
322 groove
323 mounting hole
33 notch
4 heat-conducting pad
5 housing

What is claimed is:

1. A cell supervision circuit, comprising:
   a circuit board;
   a heat transfer unit including a metal plate and a backing plate for supporting the metal plate, the heat transfer unit being fixedly connected to the circuit board by the backing plate, the metal plate being disposed adjacent to the circuit board, wherein the heat transfer unit dissipates heat through the metal plate; and
   a fixing plate connected to the heat transfer unit, wherein the fixing plate includes a body portion and an elastic portion formed on the body portion, the body portion is fixedly connected to the backing plate of the heat transfer unit, and the elastic portion is recessed toward the metal plate of the heat transfer unit and is in close contact with the metal plate under its own elasticity,
   wherein a stepped groove is provided in the backing plate and the metal plate is fitted into the stepped groove and is in contact with the elastic portion.

2. The cell supervision circuit according to claim 1, wherein the body portion of the fixing plate has a first surface and a second surface that are opposite to each other, the first surface is disposed adjacent to the metal plate, and the elastic portion is formed by being recessed from the body portion in a direction from the second surface to the first surface.

3. The cell supervision circuit according to claim 2, wherein notches are provided on both sides of the elastic portion, and the notches penetrates through the body portion.

4. The cell supervision circuit according to claim 3, wherein the elastic portion comprises two connecting members which are disposed to be spaced apart from each other, each connecting member has one end which is hung with respect to the main body portion.

5. The cell supervision circuit according to claim 3, wherein a groove is provided in the elastic portion, and the groove is formed by being recessed from the elastic portion in a direction from the first surface to the second surface.

6. The cell supervision circuit according to claim 1, wherein the number of the elastic portion is one or more, and the metal plate is fixedly connected to the elastic portion.

7. The cell supervision circuit according to claim 1, wherein two or more ribs are provided in the stepped groove to support the metal plate.

8. The cell supervision circuit according to claim 1, wherein a heat-conducting pad is further provided between the circuit board and the metal plate of the heat transfer unit.

9. A battery pack, comprising:
   a battery;
   the cell supervision circuit according to claim 1.

* * * * *